(12) United States Patent
Houston

(10) Patent No.: US 8,654,569 B2
(45) Date of Patent: Feb. 18, 2014

(54) 10T SRAM CELL WITH NEAR DUAL PORT FUNCTIONALITY

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/080,373

(22) Filed: Apr. 5, 2011

(65) Prior Publication Data

US 2011/0182112 A1 Jul. 28, 2011

Related U.S. Application Data

(62) Division of application No. 12/546,291, filed on Aug. 24, 2009.

(51) Int. Cl.
*G11C 11/00* (2006.01)
(52) U.S. Cl.
USPC .......................................... 365/154; 365/156
(58) Field of Classification Search
USPC ................................. 365/154–156
See application file for complete search history.

(56) References Cited

U.S. PATENT DOCUMENTS

| 5,973,985 | A | * | 10/1999 | Ferrant | 365/154 |
| 2006/0227595 | A1 | * | 10/2006 | Chuang et al. | 365/154 |
| 2007/0025140 | A1 | * | 2/2007 | Redwine | 365/154 |
| 2007/0035986 | A1 | * | 2/2007 | Houston | 365/154 |
| 2007/0279966 | A1 | * | 12/2007 | Houston | 365/154 |
| 2009/0175070 | A1 | * | 7/2009 | Houston | 365/154 |
| 2010/0296332 | A1 | * | 11/2010 | Houston et al. | 365/154 |
| 2010/0296333 | A1 | * | 11/2010 | Houston | 365/154 |

* cited by examiner

*Primary Examiner* — Vanthu Nguyen
*Assistant Examiner* — Khamdan Alrobaie
(74) *Attorney, Agent, or Firm* — Rose Alyssa Keagy; W. James Brady; Frederick J. Telecky, Jr.

(57) ABSTRACT

An integrated circuit including an array of SRAM cells containing a write port with a write word line and two read buffers with read word lines. The write port includes passgate transistors connected to each data node of the SRAM cell. A process of operating the integrated circuit in which source nodes of read buffer driver transistors are biased during a read operation. A process of operating the integrated circuit in which source nodes of read buffer driver transistors are floated during a read operation. A process of operating the integrated circuit in which the write port and the read ports share data lines and the source nodes of read buffer driver transistors are floated during a write operation.

23 Claims, 8 Drawing Sheets

10T SRAM CELL WITH NEAR DUAL PORT FUNCTIONALITY

CROSS-REFERENCE TO RELATED APPLICATIONS

This application is a division of application Ser. No. 12/546,291, filed Aug. 24, 2009, the content of which is hereby incorporated by reference.

FIELD OF THE INVENTION

This invention relates to the field of integrated circuits. More particularly, this invention relates to static random access memories (SRAMs) in integrated circuits.

DETAILED DESCRIPTION

Figure 1:
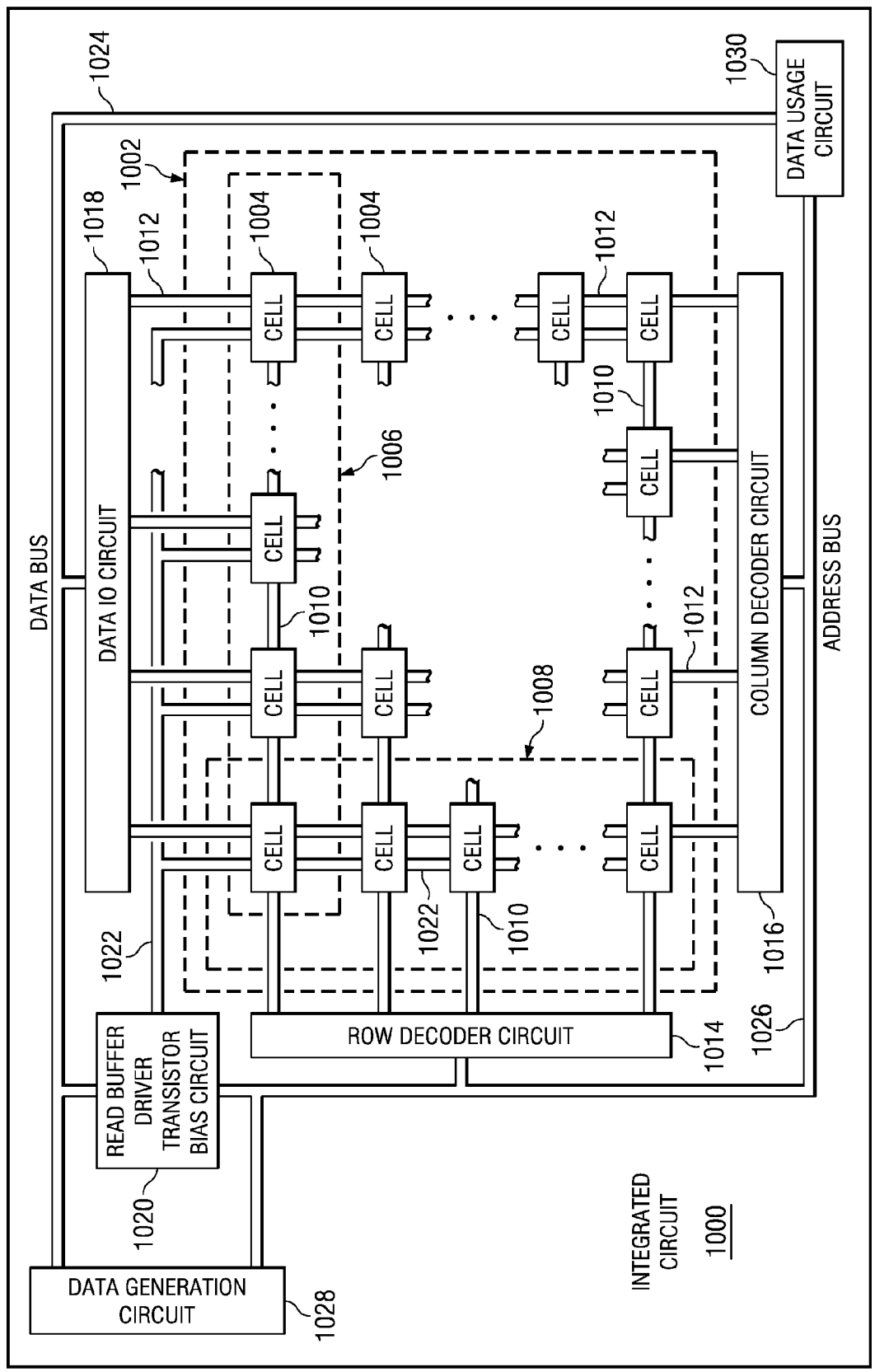
FIG. 1 depicts an integrated circuit containing an SRAM cell array which includes SRAM cells formed according to an embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the term "Vdd" is understood to refer to a power supply node with a potential suitable for source nodes of p-channel metal oxide semiconductor (PMOS) transistors. Similarly, the term "Vss" is understood to refer to a power supply node with a potential suitable for source nodes of n-channel metal oxide semiconductor (NMOS) transistors, and is lower than the Vdd potential. The term "floated" is understood to mean disconnected from a voltage source such as Vdd or Vss, or connected to a voltage source through a high impedance, for example a transistor, a resistor or a diode, so as to limit charge accumulation on a floated node.

For the purposes of this disclosure, the term "Vtn" is understood to mean an average threshold voltage of NMOS transistors in inverters of SRAM cells. The term "Vtp" is understood to mean an average threshold voltage magnitude of PMOS transistors in inverters of SRAM cells.

In this disclosure, the term "driver transistor" is understood to refer to a field effect transistor such as a metal oxide semiconductor (MOS) transistor, possibly a finFET transistor or a carbon nanotube transistor (CNT), in an SRAM cell. A drain node of the driver transistor is connected to a data node of the SRAM cell. A gate node of the driver transistor is connected to an opposite data node of the SRAM cell from the driver drain node. A source node of the driver transistor is connected to a power supply node, typically either Vdd for PMOS driver transistors or Vss for NMOS driver transistors. A polarity of the driver transistor source node power supply is opposite a polarity of a read operation pre-charge potential of a corresponding data line which is connected to the driver transistor through a passgate transistor; that is, SRAM cells in arrays which pre-charge data lines to a high voltage have NMOS driver transistors, while SRAM cells in arrays which pre-charge data lines to a low voltage have PMOS driver transistors.

Similarly, the term "load transistor" is understood to refer to another field effect transistor such as a MOS transistor, possibly a finFET transistor or a CNT, in the SRAM cell. A drain node of the load transistor is connected to a data node of the SRAM cell. A gate node of the load transistor is connected to an opposite data node of the SRAM cell from the load drain node. A source node of the load transistor is connected to a power supply node, typically either Vdd for PMOS load transistors or Vss for NMOS load transistors. A polarity of the load transistor source node power supply is the same as the polarity of a read operation pre-charge potential of a corresponding data line which is connected to the driver transistor through a passgate transistor; that is, SRAM cells in arrays which pre-charge data lines to a potential substantially equal to or above Vss have PMOS load transistors, while SRAM cells in arrays which pre-charge data lines to a potential substantially equal to or below Vdd have NMOS load transistors.

The term "passgate transistor" is understood to refer to yet another field effect transistor such as a MOS transistor, possibly a finFET transistor or a CNT, in the SRAM cell, of which one source/drain node is connected to a data node of the SRAM cell and an opposite source/drain node is connected to a corresponding data line of the SRAM cell. Similarly, the term "access transistor" is understood to refer to an MOS transistor in the SRAM cell, of which one source/drain node is connected to a data node of the SRAM cell and an opposite source/drain node is connected to a read buffer transistor. For the purposes of this disclosure, use of the term passgate transistor will be distinguished from use of the term access transistor by a convention in which passgate transistors are never connected to read buffer transistors while access transistors are always connected to read buffer transistors.

The term "word line" is understood to mean an interconnect element connected to gate nodes of passgate transistors and/or access transistors in a row of SRAM cells. The terms "bit line" and "bit-bar line" are understood to refer to data lines connected to passgate transistors or read buffers in a column of SRAM cells.

For the purposes of this disclosure, the term "bit-side" is understood to refer to components such as a driver transistor, load transistor and passgate transistor connected a data node in an SRAM cell. Similarly, the term "bit-bar-side" is understood to refer to components connected to an opposite data node from the bit-side node in the SRAM cell. A bit-side data line is commonly referred to as a bit line. A bit-bar-side data line is commonly referred to as a bit-bar line. A bit-side driver transistor is commonly referred to as a bit driver; similarly a bit-bar-side driver transistor is commonly referred to as a bit-bar driver. A bit-side load transistor is commonly referred to as a bit load; similarly a bit-bar-side load transistor is commonly referred to as a bit-bar load. A bit-side passgate transistor is commonly referred to as a bit passgate; similarly a bit-bar-side passgate transistor is commonly referred to as a bit-bar passgate.

For the purposes of this disclosure, the term "addressed SRAM cell" is understood to refer to an SRAM cell in which a passgate transistor is turned on, and a bit line is connected to read circuitry or write circuitry. The term "half-addressed SRAM cell" is understood to refer to an SRAM cell in which a passgate transistor is turned on, while a bit line is disconnected from read or write circuitry.

In some instances of integrated circuits containing SRAM cell arrays, substantially all circuits in the integrated circuit are dedicated to operation of the SRAM array. In these instances, circuits which provide data to be stored in the SRAM array and circuits which use data from the SRAM array are located outside the integrated circuit containing the SRAM array. In other instances of integrated circuits containing SRAM cell arrays, such as microprocessors, digital signal processors and wireless telephony controllers, circuits which provide data to be stored in the SRAM array and circuits which use data from the SRAM array are located in the integrated circuit.

An integrated circuit is provided; the integrated circuit contains an array of SRAM cells arranged in rows and columns. Each SRAM cell contains a write port which includes dual passgates attached to write bit lines. Each SRAM cell also contains two read buffers. Each read buffer may be connected to a read only bit line or may be connected to one of the write bit lines. During a write operation to SRAM cells in which the read buffers are attached to the write bit lines, the read buffers may be floated in addressed cells and biased. The read buffers may be turned on in half-addressed cells to reduce data upsets in the half-addressed cells. In an alternate embodiment, each SRAM cell may also contain a second write port. Each write port may be independently formed with NMOS or PMOS transistors. Similarly, each read buffer may be independently formed with NMOS or PMOS transistors.

FIG. 1 depicts an integrated circuit (1000) containing an SRAM cell array (1002) which includes SRAM cells (1004) formed according to an embodiment of the instant invention. The SRAM cells (1004) are arranged in rows (1006) and columns (1008). Each word line bus (1010) is connected to SRAM cells (1004) in a row (1006). Each word line bus (1010) may include more than one word line. Each bit line bus (1012) is connected to SRAM cells (1004) in a column (1008). Each bit line bus (1012) may include one or more data lines. A row decoder circuit (1014) applies appropriate biases to word lines in the word line buses (1010). A column decoder circuit (1016) applies appropriate biases to data lines in the bit line buses (1012). A data input/output (10) circuit (1018) reads data from the data lines in the bit line buses (1012) during read operations and applies appropriate potentials to the data lines in the bit line buses (1012) during write operations. In some embodiments, read circuitry may be connected to data lines which are connected to write ports in the SRAM cells (1004), so that read operations may be performed through the write ports. In some embodiments, a read buffer driver transistor bias circuit (1020) applies biases to a read buffer driver bus (1022) which is connected to read buffer driver transistors in the SRAM cells (1004). The read buffer driver transistor bias circuit (1020) is capable of biasing the read buffer driver transistors independently by column. The integrated circuit further includes a data bus (1024) which carries data bits between the SRAM cell array (1002) and circuits in the integrated circuit (1000), and an address bus (1026) which is used to select SRAM cells (1004) in the SRAM cell array (1002) for read and write operations. The address bus (1026) is connected to the row decoder circuit (1014), the column decoder circuit (1016) and the read buffer driver transistor bias circuit (1020). The integrated circuit (1000) may also contain a data generation circuit (1028) which connects to the data bus (1024) and address bus (1026). The data generation circuit (1028) produces incoming data bits for storage in the SRAM cell array (1002). The data bus (1024) carries the incoming data bits from the data generation circuit (1028) to the SRAM cell array (1002). The integrated circuit (1000) may also contain a data usage circuit (1030) which connects to the data bus (1024) and address bus (1026). The data usage circuit (1030) uses outgoing data bits which were stored in the SRAM cell array (1002). The data bus (1024) carries the outgoing data bits from the SRAM cell array (1002) to the data usage circuit (1030).

Figure 2:
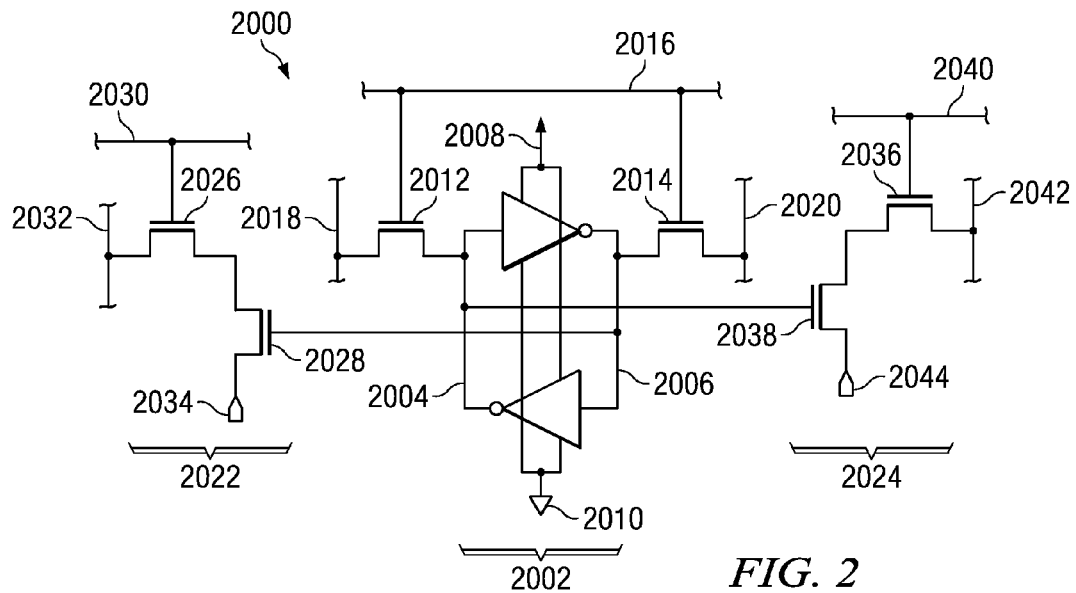
FIG. 2 is a circuit diagram of one SRAM cell in an SRAM cell array contained in an integrated circuit formed according to the instant invention.

FIG. 2 is a circuit diagram of one SRAM cell in an SRAM cell array (such as 1002 of FIG. 1) contained in an integrated circuit (1000). During the operation of the integrated circuit (1000), the SRAM cell (2000) may function as an addressed SRAM cell or a half-addressed SRAM cell. The SRAM cell (2000) contains a pair of cross-coupled inverters (2002) which includes a bit-side data node (2004) and a bit-bar-side data node (2006). Power is supplied to the pair of cross-coupled inverters (2002) through an inverter Vdd node (2008). Ground potential is provided to the pair of cross-coupled inverters (2002) through an inverter Vss node (2010). The SRAM cell (2000) further contains a write port which includes a bit-side passgate transistor (2012) and a bit-bar-side passgate transistor (2014). The passgate transistors (2012, 2014) are depicted in FIG. 2 as NMOS transistors, but may be PMOS transistors in other embodiments. A gate node of the bit-side passgate transistor (2012) and a gate node of the bit-bar-side passgate transistor (2014) are connected to a write word line (2016). A first source/drain node of the bit-side passgate transistor (2012) is connected to the bit-side data node (2004) and a second source/drain node of the bit-side passgate transistor (2012) is connected to a bit-side write data line (2018). Similarly, a first source/drain node of the bit-bar-side passgate transistor (2014) is connected to the bit-bar-side data node (2006) and a second source/drain node of the bit-bar-side passgate transistor (2014) is connected to a bit-bar-side write data line (2020).

The SRAM cell (2000) further contains a first read buffer (2022) and a second read buffer (2024). The first read buffer (2022) includes a first access transistor (2026) and a first read buffer driver transistor (2028). The first access transistor (2026) and the first read buffer driver transistor (2028) are depicted in FIG. 2 as NMOS transistors, but may be PMOS transistors in other embodiments. A gate node of the first access transistor (2026) is connected to a first read only word line (2030). A first source/drain node of the first access transistor (2026) is connected to a first read data line (2032). A second source/drain node of the first access transistor (2026) is connected to a drain node of the first read buffer driver transistor (2028). A gate node of the first read buffer driver transistor (2028) is connected to one of the data nodes (2004, 2006). A first read buffer driver source node (2034) of the first read buffer driver transistor (2028) may be floated or biased (for example by a read buffer driver transistor bias circuit that is not shown) during read and write operations.

The second read buffer (2024) is configured similarly to the first read buffer (2022), and includes a second access transistor (2036), connected to second read only word line (2040) and a second read data line (2042), and a second read buffer driver transistor (2038). A gate node of the second read buffer driver transistor (2038) is connected to one of the data nodes (2004, 2006). A second read buffer driver source node (2044) of the second read buffer driver transistor (2038) may be floated or biased during read and write operations.

During a write operation on the SRAM cell (2000), write data is applied to the bit-side write data line (2018) and the bit-bar-side write data line (2020). In one embodiment of a write operation, the first read buffer driver source node (2034) and the second read buffer driver source node (2044) may be floated to reduce leakage current in the SRAM cell (2000).

During a read operation from the first read buffer (2022), the first read buffer driver source node (2034) is biased to provide a desired read current. The passgate transistors (2012, 2014) are not turned on so as to avoid data upsets. Data upsets are events in which data values in SRAM cells unintentionally become inverted. The second read buffer driver source node (2044) may be floated to advantageously reduce leakage current. Reading from the second read buffer (2024) is performed similarly, with appropriate changes in bias or float conditions applied to the read buffer driver source nodes (2034, 2044). In an alternate embodiment of the instant invention, read circuitry may be connected to the bit-side write data line (2018) and the bit-bar-side write data line (2020) so that a read operation may be performed through the write port.

Configuring the SRAM cell (2000) with read buffers (2022, 2024) enables concurrent read operations on the SRAM cell (2000) without risking data upsets, thereby possibly increasing the read operation throughput in an SRAM cell array of the SRAM cell (2000).

Figure 3A:
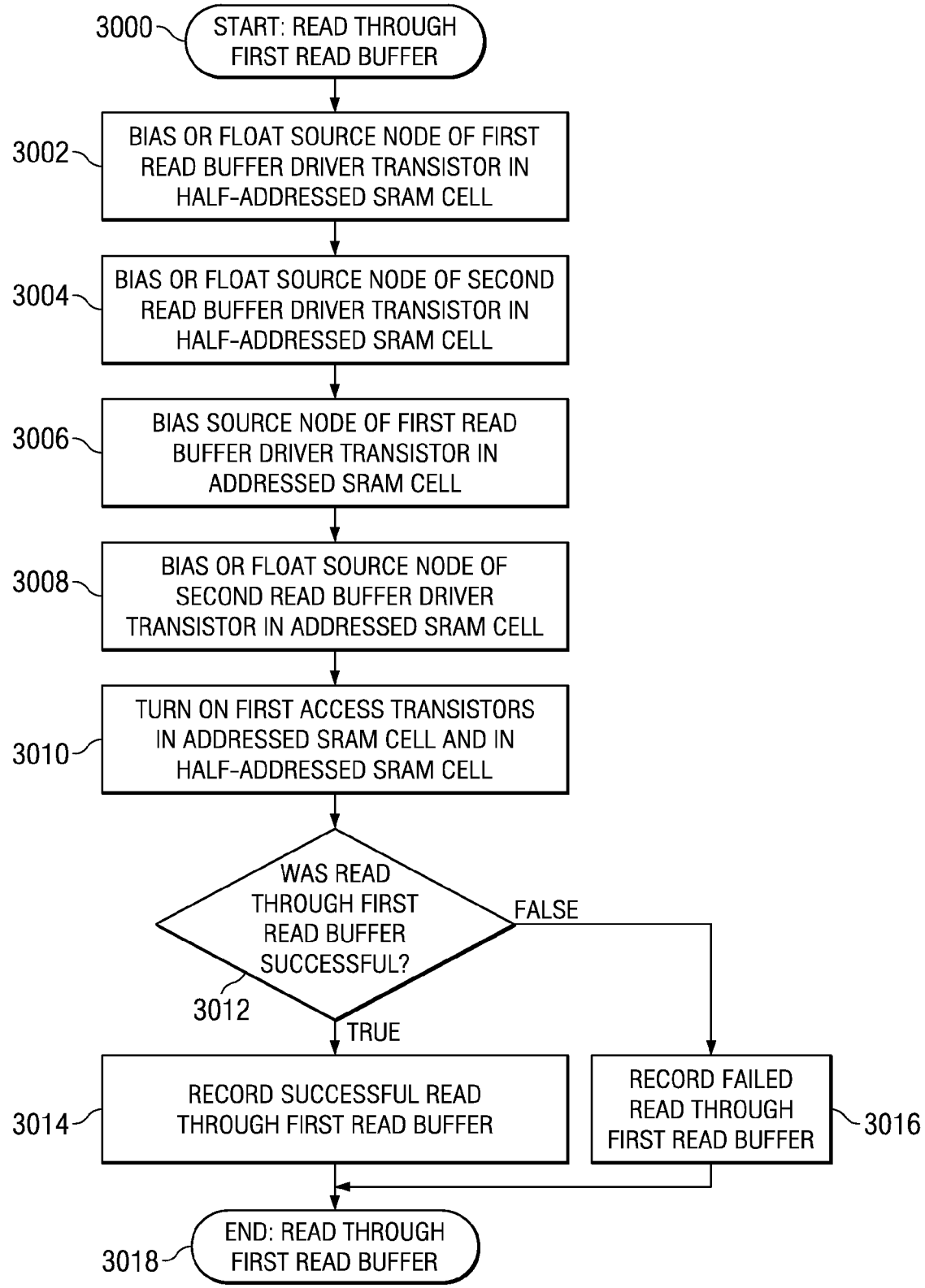
FIG. 3A and FIG. 3B are flowcharts of a read operation through a first read buffer and a read operation through a write port, respectively.
Figure 3B:
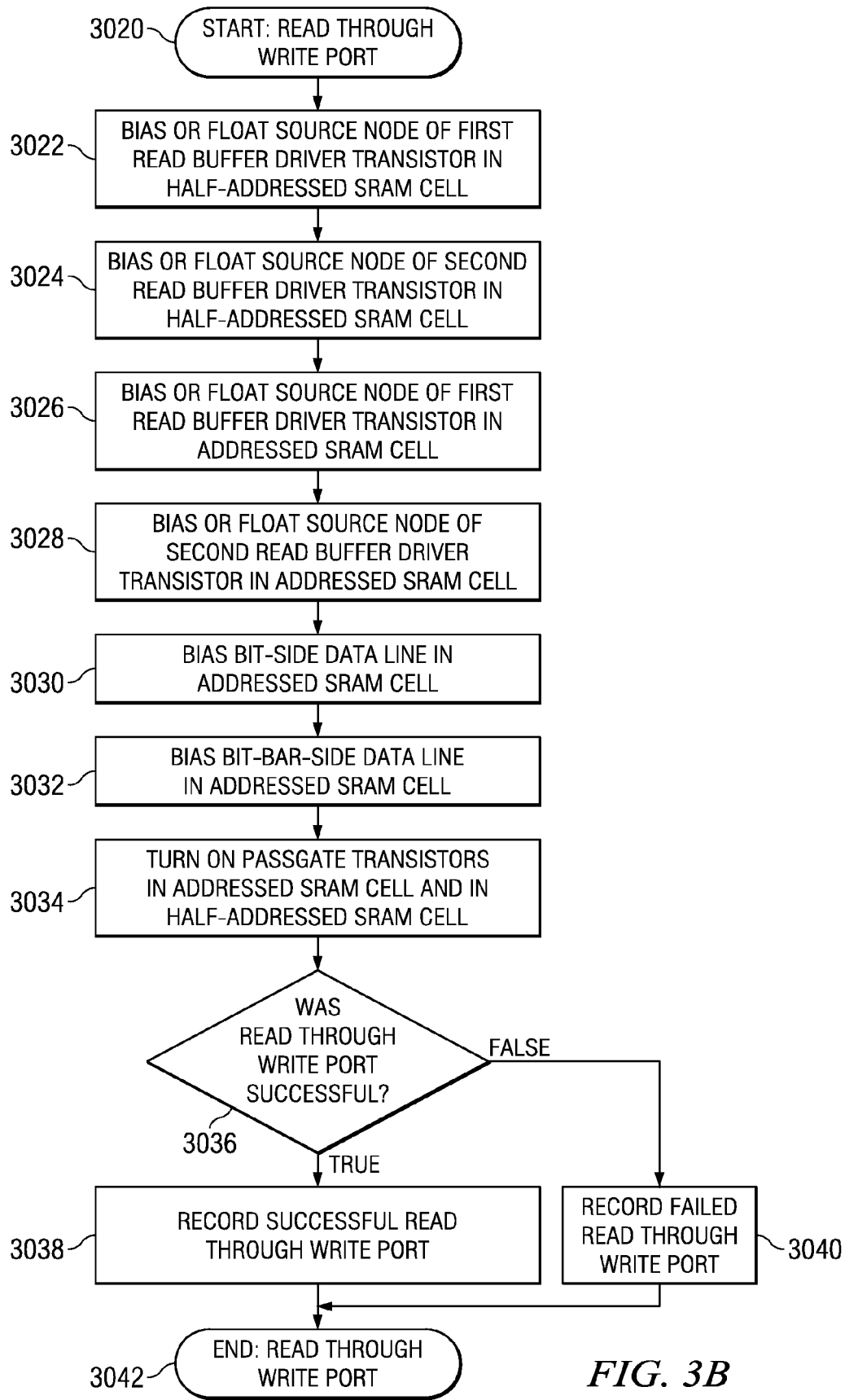

FIG. 3A and FIG. 3B are flowcharts of a read operation through a first read buffer and a read operation through a write port, respectively. The flowcharts in FIG. 3A and FIG. 3B refer to an SRAM cell (2000) depicted in FIG. 2 that is functioning as an addressed SRAM cell or a half-addressed SRAM cell. Referring to FIG. 3A, the read through first read buffer operation (3000) begins with step (3002), which is to bias or float a source node (2034) of a first read buffer driver transistor (2028) in a half-addressed SRAM cell (2000). In one embodiment, the source node (2034) of the first read buffer driver transistor (2028) in the half-addressed SRAM cell may be floated. In another embodiment, the source node (2034) of the first read buffer driver transistor (2028) in the half-addressed SRAM cell may be biased to a potential substantially equal to a potential on the inverter Vss node (2010). Step (3004) is to bias or float a source node (2044) of a second read buffer driver transistor (2038) in the half-addressed SRAM cell. In one embodiment, the source node (2044) of the second read buffer driver transistor (2038) in the half-addressed SRAM cell may be floated. In another embodiment, the source node (2044) of the second read buffer driver transistor (2038) in the half-addressed SRAM cell may be biased to a potential substantially equal to a potential on the inverter Vss node (2010). Step (3006) is to bias a source node of a first read buffer driver transistor (2028) in an addressed SRAM cell (2000). In one embodiment, the source node (2034) of the first read buffer driver transistor (2028) in the addressed SRAM cell may be biased to the potential on the inverter Vss node (2010). Step (3008) is to bias or float a source node of a second read buffer driver transistor (2044) in the addressed SRAM cell. In one embodiment, the source node (2044) of the second read buffer driver transistor (2038) in the addressed SRAM cell may be floated. In another embodiment, the source node (2044) of the second read buffer driver transistor (2038) in the addressed SRAM cell may be biased to a potential on the inverter Vss node (2010). Step (3010) is to turn on a first access transistor (2026) in the addressed SRAM cell (2000) and to turn on a first access transistor (2026) in the half-addressed SRAM cell (2000), by applying an appropriate potential to a first read only word line (2030) connected to gate nodes of the first access transistor (2026) in the addressed SRAM cell (2000) and the first access transistor (2026) in the half-addressed SRAM cell (2000).

In embodiments of the read through first read buffer operation that are a part of test operations, following execution of step (3010), step (3012) is executed, which is to determine if data value in the cross-coupled inverters (2002) in the addressed SRAM cell (2000) was successfully transferred to a first read data line (2032). If the data value in the cross-coupled inverters (2002) in the addressed SRAM cell was successfully transferred to the first read data line (2032), step (3014) is executed, which is to record a successful read through first read buffer operation for the addressed SRAM cell. If the data value in the cross-coupled inverters (2002) in the addressed SRAM cell was not successfully transferred to the first read data line (2032), step (3016) is executed, which is to record a failed read through first read buffer operation for the addressed SRAM cell. After step (3014) or step (3016) is executed, or after step (3010) is executed in embodiments which are not part of test operations, the read through first read buffer operation is ended (3018). In other embodiments of the read through first read buffer operation, steps (3002), (3004), (3006) and (3008) may be performed in any order. Floating one or more of the source nodes of the read buffer driver transistors (2028, 2038) in the SRAM cells (2000) may reduce leakage current in the SRAM cells.

Referring to FIG. 3B, the read through write port operation (3020) begins with step (3022) which is to bias or float a source node of a first read buffer driver transistor (2030) in a half-addressed SRAM cell (2000). In one embodiment, the source node (2034) of the first read buffer driver transistor (2028) in the half-addressed SRAM cell may be floated. In another embodiment, the source node (2034) of the first read buffer driver transistor (2028) in the half-addressed SRAM cell may be biased to a potential substantially equal to a potential on the inverter Vss node (2010). Step (3024) is to bias or float a source node of a second read buffer driver transistor (2038) in the half-addressed SRAM cell (2000). In one embodiment, the source node (2044) of the second read buffer driver transistor (2038) in the half-addressed SRAM cell may be floated. In another embodiment, the source node (2044) of the second read buffer driver transistor (2038) in the half-addressed SRAM cell may be biased to a potential substantially equal to a potential on the inverter Vss node (2010). Step (3026) is to bias or float a source node (2034) of a first read buffer driver transistor (2028) in an addressed SRAM cell (2000). In one embodiment, the source node (2034) of the first read buffer driver transistor in the addressed SRAM cell may be floated. In another embodiment, the source node (2034) of the first read buffer driver transistor (2028) in the addressed SRAM cell may be biased to a potential substantially equal to a potential on the inverter Vss node (2010).

Step (3028) is to bias or float a source node (2044) of a second read buffer driver transistor (2038) in the addressed SRAM cell (2000). In one embodiment, the source node (2044) of the second read buffer driver transistor (2038) in the addressed SRAM cell may be floated. In another embodiment, the source node (2044) of the second read buffer driver transistor (2038) in the addressed SRAM cell may be biased to a potential substantially equal to a potential on the inverter Vss node (2010). Step (3030) is to bias a bit-side write data line (2018) in the addressed SRAM cell (2000) to a potential appropriate for a read through write port operation. In embodiments of SRAM cells with NMOS drivers, the bit-side write data line (2018) in the addressed SRAM cell may be biased to a potential near Vdd. In embodiments of SRAM cells with PMOS drivers, the bit-side write data line (2018) in the addressed SRAM cell may be biased to a potential near Vss. Step (3032) is to bias a bit-bar-side write data line (2020) in the addressed SRAM cell (2000) to a potential appropriate for a read through write port operation. In one embodiment, the bit-bar-side write data line (2020) and the bit-side write data line (2018) in the addressed SRAM cell are biased to substantially equal potentials. Step (3034) is to turn on a bit-side passgate transistor (2012) and a bit-bar-side passgate transistor (2014) in the addressed SRAM cell (2000) and to turn on a bit-side passgate transistor (2012) and a bit-bar-side passgate transistor (2014) in the half-addressed SRAM cell (2000), by applying an appropriate potential to a write word line (2016) connected to gate nodes of the bit-side passgate transistor (2012) and the bit-bar-side passgate transistor (2014) in the addressed SRAM cell and the bit-side passgate transistor (2012) and the bit-bar-side passgate transistor (2014) in the half-addressed SRAM cell.

In embodiments of the read through write port operation that are a part of test operations; then following the execution of step (3030), step (3036) is executed, which is to determine if data value in the cross-coupled inverters (2002) in the addressed SRAM cell (2000) was successfully transferred to the bit-side write data line (2018) and the bit-bar-side write data line (2020) and if there was a data upset in the half-addressed SRAM cell (2000). If the data value in the cross-coupled inverters (2002) in the addressed SRAM cell was successfully transferred to the bit-side write data line (2018) and the bit-bar-side write data line (2020) and there was no data upset in the half-addressed SRAM cell, then step (3038) is executed, which is to record a successful read through write port operation for the addressed SRAM cell. If the data value in the cross-coupled inverters (2002) in the addressed SRAM cell was not successfully transferred to the bit-side write data line (2018) and the bit-bar-side write data line (2020) or there was a data upset in the half-addressed SRAM cell, then step (3040) is executed, which is to record a failed read through write port operation for the addressed SRAM cell. After step (3038) or step (3040) is executed, or after step (3030) is executed in embodiments which are not part of test operations, the read through write port operation is ended (3042). In other embodiments of the read through write port operation, steps (3022), (3024), (3026), (3028), (3030) and (3032) may be performed in any order. Floating one or more of the source nodes of the read buffer driver transistors (2022, 2024) in the SRAM cells (2000) may reduce leakage current in the SRAM cells.

Figure 4:
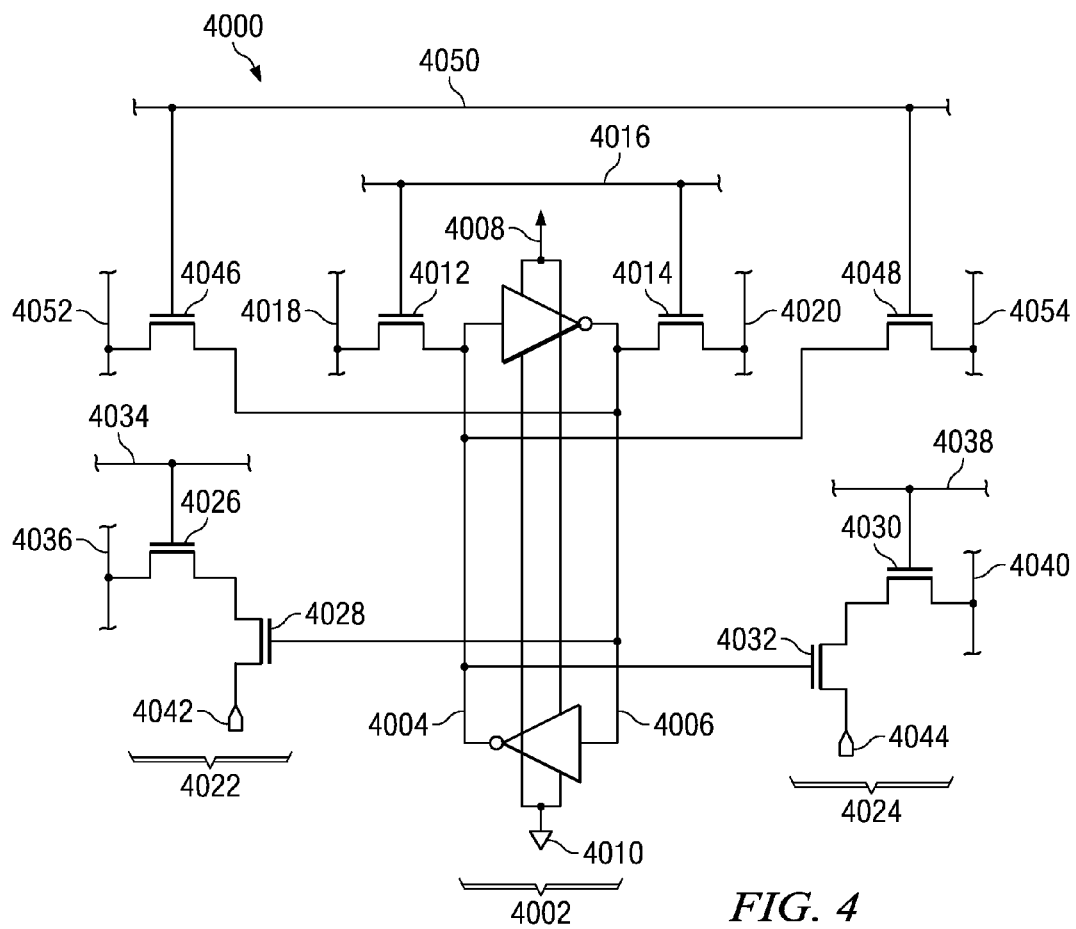
FIG. 4 is a circuit diagram of an SRAM cell, formed according to another embodiment of the instant invention, containing two write ports.

FIG. 4 is a circuit diagram of an SRAM cell, formed according to another embodiment of the instant invention, containing two write ports. The SRAM cell (4000) contains a pair of cross-coupled inverters (4002) which includes a bit-side data node (4004) and a bit-bar-side data node (4006). Power is supplied to the pair of cross-coupled inverters (4002) through an inverter Vdd node (4008). Ground potential is provided to the pair of cross-coupled inverters (4002) through an inverter Vss node (4010). The SRAM cell (4000) contains a first write port which includes a first bit-side passgate transistor (4012) and a first bit-bar-side passgate transistor (4014) connected to a first write word line (4016), a first bit-side write data line (4018) and a first bit-bar-side write data line (4020), as described in reference to FIG. 2. The SRAM cell (4000) further contains a first read buffer (4022) and a second read buffer (4024) which include a first access transistor (4026), a first read buffer driver transistor (4028), a second access transistor (4030) and a second read buffer driver transistor (4032), connected to a first read only word line (4034), a first read data line (4036), a second read only word line (4038) and a second read data line (4040), as described in reference to FIG. 2. A first read buffer driver source node (4042) and a second read buffer driver source node (4044) may be floated or biased (for example by a read buffer driver transistor bias circuit, not shown) during read and write operations, as described in reference to FIG. 2.

The SRAM cell (4000) further contains a second write port which includes a second bit-side passgate transistor (4046) and a second bit-bar-side passgate transistor (4048) connected to a second write word line (4050), a second bit-side write data line (4052) and a second bit-bar-side write data line (4054), configured similarly to the first write port.

Data may be written to the SRAM cell (4000) through the first write port and the second write port, providing dual write port functionality. Data may be read from the SRAM cell (4000) through the first read buffer (4022) and the second read buffer (4024), as described in reference to FIG. 2. In an alternate embodiment, data may be read from the SRAM cell (4000) through the first write port and the second write port.

Adding a second write port enables concurrent write operations to two SRAM cells in a same row of an SRAM cell array containing the SRAM cell (4000), thereby possibly increasing the write operation throughput of the SRAM cell array. Adding read buffers advantageously further increases read operation throughput of an SRAM cell array (such as 1002 of FIG. 1) containing the SRAM cell (4000).

Figure 5:
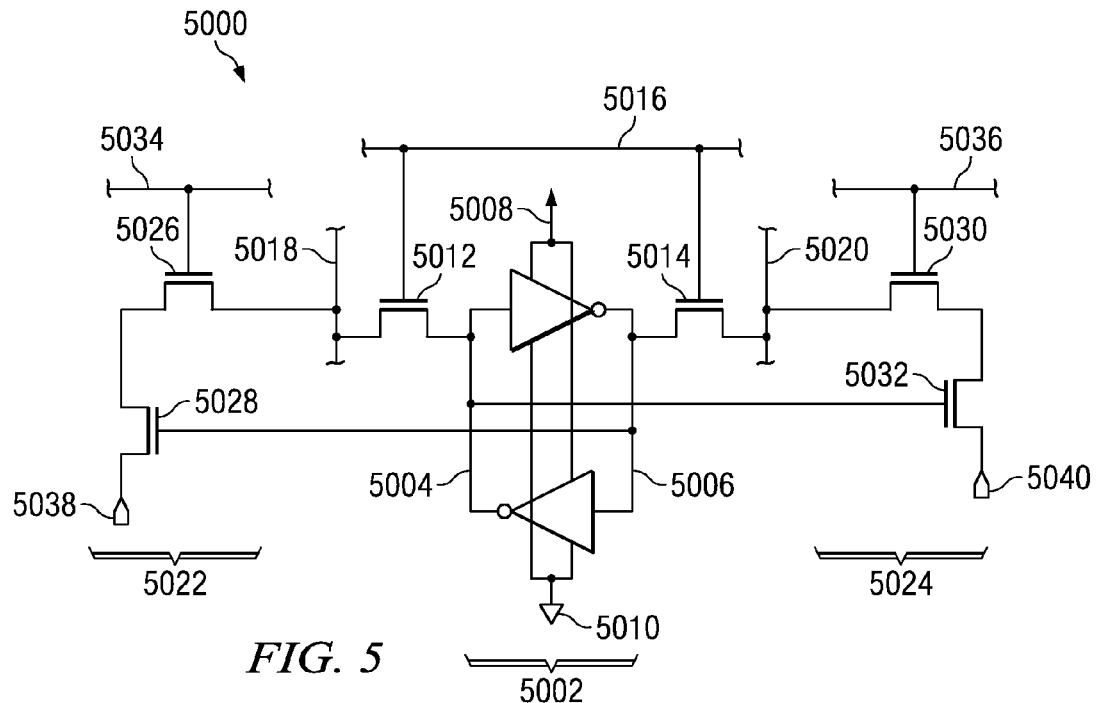
FIG. 5 is a circuit diagram of an SRAM cell, formed according to an alternate embodiment of the instant invention.

FIG. 5 is a circuit diagram of an SRAM cell, formed according to an alternate embodiment of the instant invention, in which read buffers and a write port share data lines. The SRAM cell (5000) contains a pair of cross-coupled inverters (5002) which includes a bit-side data node (5004) and a bit-bar-side data node (5006). Power is supplied to the pair of cross-coupled inverters (5002) through an inverter Vdd node (5008). Ground potential is provided to the pair of cross-coupled inverters (5002) through an inverter Vss node (5010). The SRAM cell (5000) contains a write port which includes a bit-side passgate transistor (5012) and a bit-bar-side passgate transistor (5014). Gate nodes of the passgate transistors (5012, 5014) are connected to a write word line (5016). Source/drain nodes of the passgate transistors (5012, 5014) are connected to a bit-side data line (5018) and a bit-bar-side data line (5020) as shown in FIG. 5.

The SRAM cell (5000) further contains a first read buffer (5022) that includes a first access transistor (5026), a first read buffer driver transistor (5028). The SRAM cell (5000) also contains a second read buffer (5024) that includes a second access transistor (5030) and a second read buffer driver transistor (5032). Gate nodes of the first access transistor (5026) and second access transistor (5030) are connected to a first read only word line (5034) and a second read only word line (5036), respectively. A source/drain node of the first access transistor (5026) is connected to the bit-side data line (5018). A source/drain node of the second access transistor (5030) is connected to the bit-bar-side data line (5020). A gate node of the first read buffer driver transistor (5028) is connected to the bit-bar-side data node (5006). A gate node of the second read buffer driver transistor (5032) is connected to the bit-side data node (5004).

A first read buffer driver source node (5038) and a second read buffer driver source node (5040) may be floated or biased (for example by a read buffer driver transistor bias circuit, not shown) during read and write operations. The bit-side data line (5018) serves as a bit-side write data line during write operations and as a first read data line during read operations through the first read buffer (5022). Similarly, the bit-bar-side data line (5020) serves as a bit-bar-side write data line during write operations and as a second read data line during read operations through the second read buffer (5024). Configuring the read buffers (5018, 4020) to share data lines with the write port may reduce the area occupied by the SRAM cell (5000), possibly reducing fabrication costs of the integrated circuit containing an SRAM array of SRAM cells (5000).

In an alternate embodiment, an SRAM cell (5000) may contain a write port connected to a bit-side data line (5018) and a bit-bar-side data line (5020), as described in reference to FIG. 4. The SRAM cell may further contain a first read buffer connected to the bit-side data line (5018), as described in reference to FIG. 4. The SRAM cell may also contain a second read buffer connected to a read data line that is distinct from the bit-side data line and the bit-bar-side data line.

During on embodiment of a write operation, source nodes (5038, 5040) of read buffer driver transistors (5028, 5032) in an addressed SRAM cell (5000) may be floated, possibly reducing interference with data transfer from data lines (5018, 5020) to data nodes (5004, 5006) in the addressed SRAM cell (5000). Source nodes (5038, 5040) of read buffer driver transistors (5028, 5032) in a half-addressed SRAM cell (5000) may be biased near Vss and the access transistors (5026, 5030) in the half-addressed SRAM cell (5000) may be turned on, possibly increasing a static noise margin value in the half-addressed SRAM cell (5000).

Figure 6:
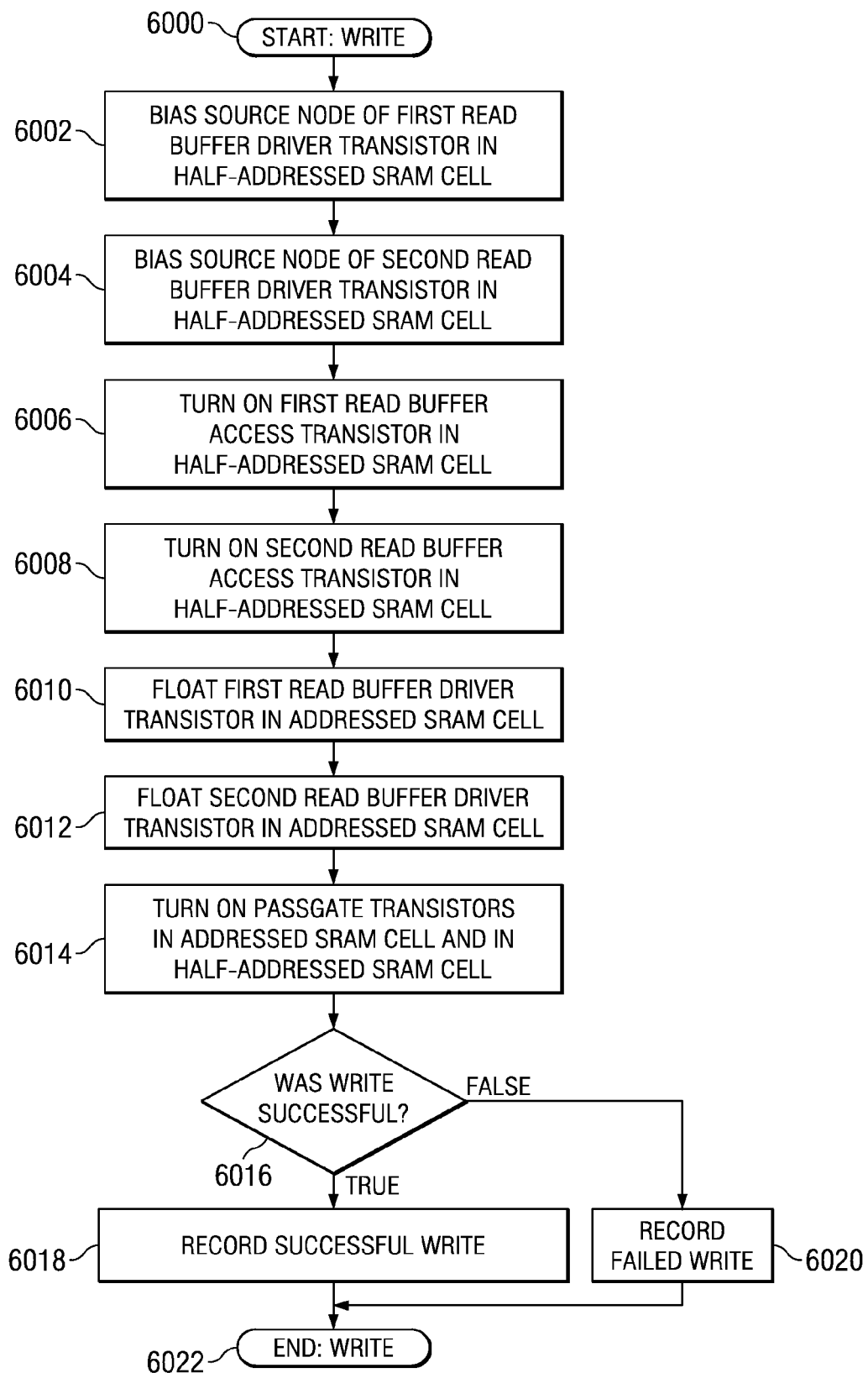
FIG. 6 is a flowchart of a write process performed on an SRAM array containing SRAM cells as described in reference to FIG. 5.

FIG. 6 is a flowchart of a write process performed on an SRAM array (1002 of FIG. 1) containing SRAM cells (5000) as described in reference to FIG. 5. The write process begins (6000) with step (6002) which is to bias a source node (5038) of a first read buffer driver transistor (5028) in a half-addressed SRAM cell (5000). In one embodiment, the source node (5038) of the first read buffer driver transistor (5028) may be biased to a potential substantially equal to or below Vdd minus Vtn. In another embodiment, the source node (5038) of the first read buffer driver transistor (5028) may be biased to a potential substantially equal to or below Vss plus Vtn. In a further embodiment, the source node (5038) of the first read buffer driver transistor (5028) may be biased to a potential substantially equal to or below Vss. Step (6004) is to bias a source node (5040) of a second read buffer driver transistor (5032) in the half-addressed SRAM cell (5000). In one embodiment, the source node (5040) of a second read buffer driver transistor (5032) may be biased to a same potential as potential on the inverter Vdd node (5008). In an alternate embodiment, the source node (5040) of the second read buffer driver transistor (5032) may be biased to a potential substantially equal to or below Vdd minus Vtn. In another embodiment, the source node (5040) of the second read buffer driver transistor (5032) may be biased to a potential substantially equal to or below Vss plus Vtn. In a further embodiment, the source node (5040) of the second read buffer driver transistor (5032) may be biased to a potential substantially equal to or below Vss.

Step (6006) is to turn on a first access transistor (5026) attached to the first read buffer driver transistor (5028) in the half-addressed cell (5000). Step (6008) is to turn on a second access transistor (5030) attached to the second read buffer driver transistor (5032) in the half-addressed cell (5000). Step (6010) is to float a source node (5038) of a first read buffer driver transistor (5028) in an addressed SRAM cell (5000). Step (6012) is to float a source node (5040) of a second read buffer driver transistor (5032) in the addressed SRAM cell (5000). Subsequently, step (6014) is executed, which is to turn on passgate transistors (5012, 5014) in the addressed SRAM cell (5000) and in the half-addressed SRAM cell (5000).

In embodiments of the write operation that are a part of test operations; following execution of step (6014), step (6016) is executed, which is to determine if write data was successfully transferred to data nodes (5004, 5006) of the addressed SRAM cell (5000) and to determine if there was a data upset in the half-addressed SRAM cell (5000). If the write data was successfully transferred to the data nodes (5004, 5006) and there was no data upset in the half-addressed SRAM cell, step (6018) is executed, which is to record a successful write operation for the addressed SRAM cell. If the write data was not successfully transferred to the data nodes (5004, 5006) or there was a data upset in the half-addressed SRAM cell, then step (6020) is executed, which is to record a failed write operation for the addressed SRAM cell. After step (6018) or step (6020) is executed, or after step (6014) is executed in embodiments that are not part of test operations, the write operation is ended (6022). In other embodiments of the write operation, steps (6002), (6004), (6006), (6008) (6010) and (6012) may be performed in any order.

Figure 7:
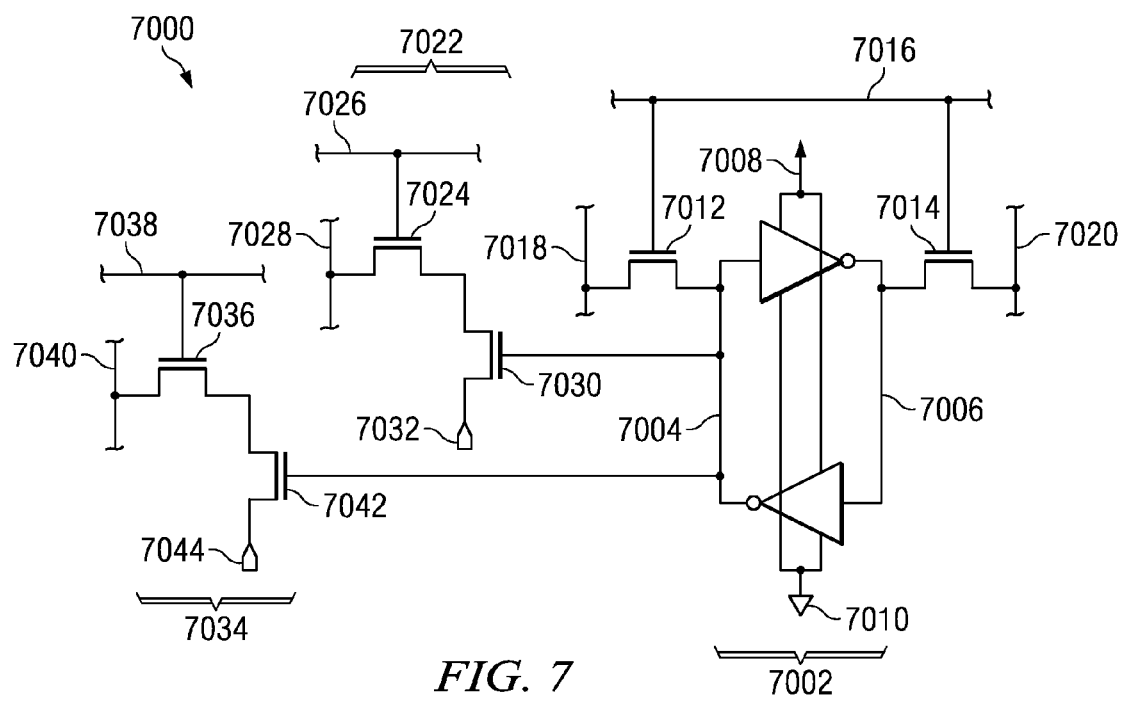
FIG. 7 is a circuit diagram of an SRAM cell containing two read buffers formed according to another embodiment of the instant invention.

FIG. 7 is a circuit diagram of an SRAM cell containing two read buffers formed according to another embodiment of the instant invention, in which both read buffers are connected to one data node. The SRAM cell (7000) contains a pair of cross-coupled inverters (7002) which includes a bit-side data node (7004) and a bit-bar-side data node (7006). Power is supplied to the pair of cross-coupled inverters (7002) through an inverter Vdd node (7008). Ground potential is provided to the pair of cross-coupled inverters (7002) through an inverter Vss node (7010). The SRAM cell (7000) contains a write port, configured as described in reference to FIG. 2, which includes a bit-side passgate transistor (7012) and a bit-bar-side passgate transistor (7014). Gate nodes of the passgate transistors (7012, 7014) are connected to a write word line (7016). Source/drain nodes of the passgate transistors (7012, 7014) are connected to a bit-side data line (7018) and a bit-bar-side data line (7020) as shown in FIG. 7.

The SRAM cell (7000) contains a first read buffer (7022) connected to the bit-side data node (7004). The first read buffer (7022) includes a first access transistor (7024) connected to a first read only word line (7026) and a first read data line (7028), plus a first read buffer driver transistor (7030) with a first source node (7032), configured as described in reference to FIG. 2. The SRAM cell (7000) further contains a second read buffer (7034) that is also connected to the bit-side data node (7004). The second read buffer (7034) includes a second access transistor (7036) connected to a second read only word line (7038) and a second read data line (7040), plus a second read buffer driver transistor (7042) with a second source node (7044), configured as described in reference to FIG. 2. Configuring both read buffers (7022, 7034) on one data node (7004) may reduce the area occupied by the SRAM cell (7000), possibly reducing the fabrication costs of an integrated circuit (1000) containing an SRAM cell array (1002) of the SRAM cells (7000).

Figure 8:
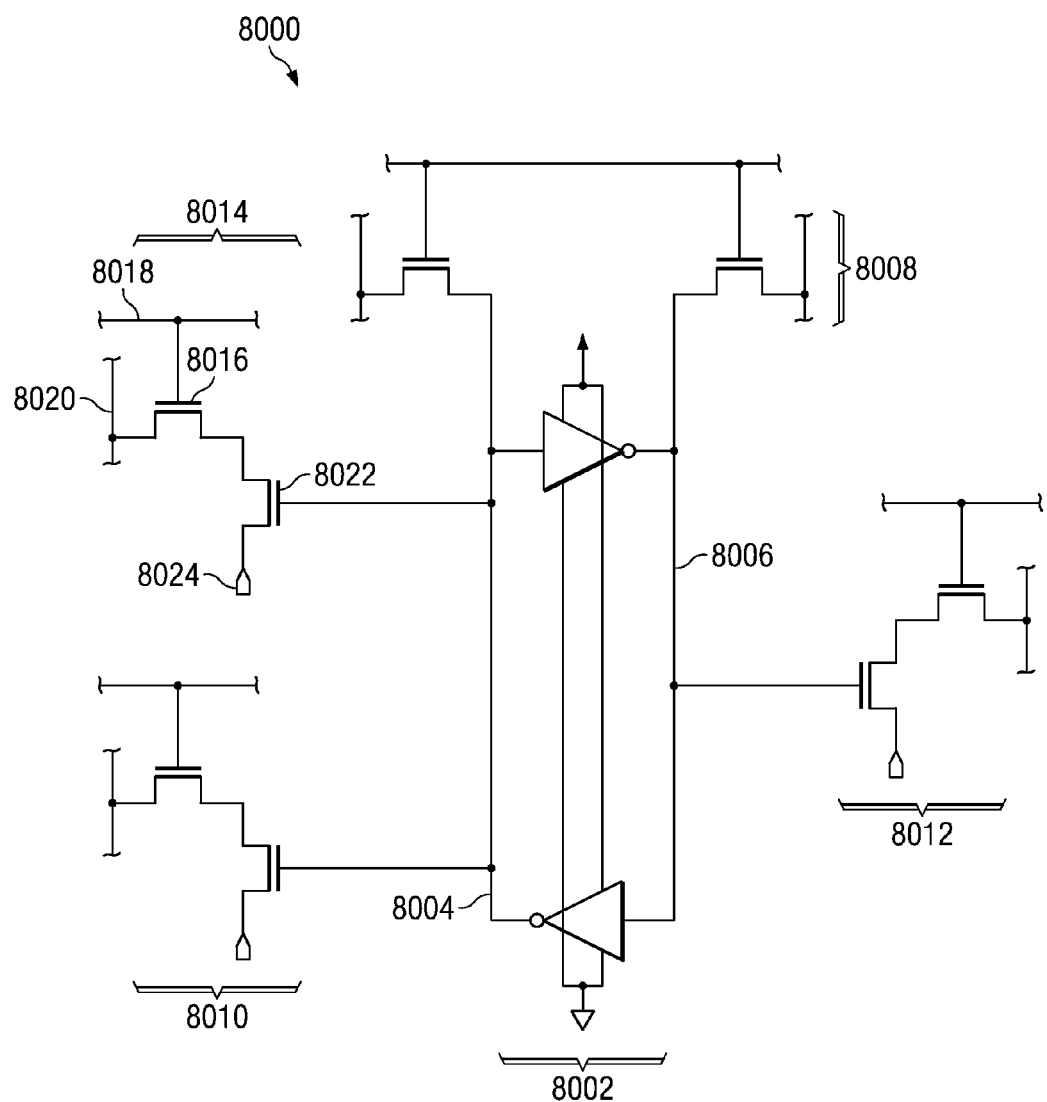
FIG. 8 is a circuit diagram of an SRAM cell containing three read buffers formed according to a further embodiment of the instant invention.

FIG. 8 is a circuit diagram of an SRAM cell containing three read buffers formed according to a further embodiment of the instant invention, in which two read buffers are connected to one data node and a third read buffer is connected to an opposite data node. The SRAM cell (8000) contains a pair of cross-coupled inverters (8002) which includes a bit-side data node (8004) and a bit-bar-side data node (8006). The cross-coupled inverters (8002) are similar to those described in reference to FIG. 2, FIG. 4, FIG. 5 and FIG. 7. The SRAM cell (8000) contains a write port (8008), configured as described in reference to FIG. 2. The SRAM cell (8000) contains a first read buffer (8010) connected to the bit-side data node (8004), as described in reference to FIG. 2. The SRAM cell (8000) also contains a second read buffer (8012) connected to the bit-bar-side data node (8006), as described in reference to FIG. 2. In the instant embodiment, the SRAM cell (8000) contains a third read buffer (8014) connected, to the bit-side data node (8004). However, it is within the scope of the invention to connect the third read buffer (8014) to the bit-bar-side data node (8006) instead of the bit-side data node (8004). The third read buffer (8014) includes a third access transistor (8016) connected to a third read only word line (8018) and a third read data line (8020). The third read buffer (8014) also includes a third read buffer driver transistor (8022) with a third source node (8024), configured as described in reference to the second read buffer (7034) in FIG. 7. Forming three read buffers in an SRAM cell may provide increased data read throughput for an integrated circuit containing the SRAM cell (8000).

Figure 9:
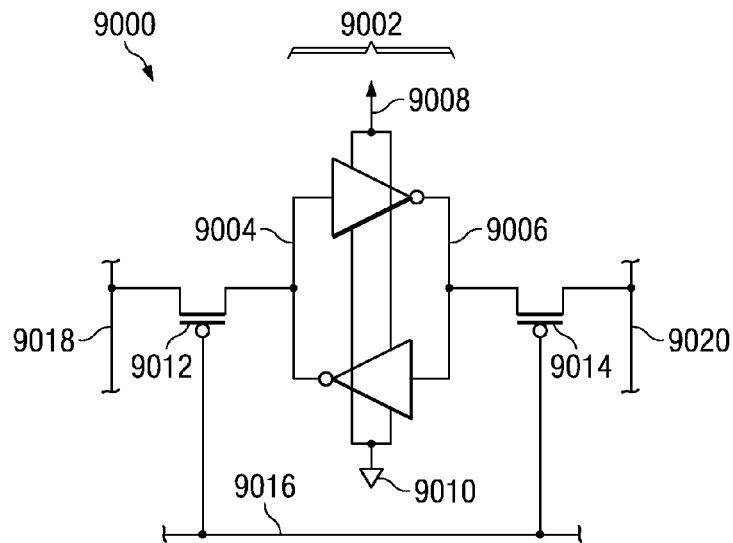
FIG. 9 is a circuit diagram of a part of an SRAM cell containing a write port with PMOS passgate transistors.

The write ports in SRAM cells (as described in reference to FIG. 2, FIG. 4, FIG. 5 and FIG. 7) may be formed with PMOS passgate transistors. FIG. 9 is a circuit diagram of a part of an SRAM cell containing a write port with PMOS passgate transistors. The SRAM cell (9000) contains a pair of cross coupled inverters (9002) which include a bit-side data node (9004) and a bit-bar-side data node (9006). Power is supplied to the pair of cross-coupled inverters (9002) through an inverter Vdd node (9008). Ground potential is provided to the pair of cross-coupled inverters (9002) through an inverter Vss node (9010). The SRAM cell (9000) contains a write port which includes a PMOS bit-side passgate transistor (9012) and a PMOS bit-bar-side passgate transistor (9014). Gate nodes of the passgate transistors (9008, 9010) are connected to a write only word line (9012). A first source/drain node of each passgate transistor (9012, 9014) are connected to a data node (9004, 9006), as described in reference to FIG. 2. A second source/drain node of the bit-side passgate transistor (9012) is connected to a bit-side data line (9018), and a second source/drain node of the bit-bar-side passgate transistor (9014) is connected to a bit-bar-side data line (9020). Forming the write port with PMOS passgate transistors (9012, 9014) may enable a reduction in the size of the SRAM cell (9000), possibly reducing fabrication costs of an integrated circuit (1000) containing an SRAM cell array (1002) of the SRAM cells (9000). Forming the write port with PMOS passgate transistors (9012, 9014) may also enable the adjustment of the on-state currents of the passgate transistors (9012, 9014) by adjusting biases to n-wells containing the passgate transistors (9012, 9014); possibly improving the write margins and reducing data upsets.

Figure 10:
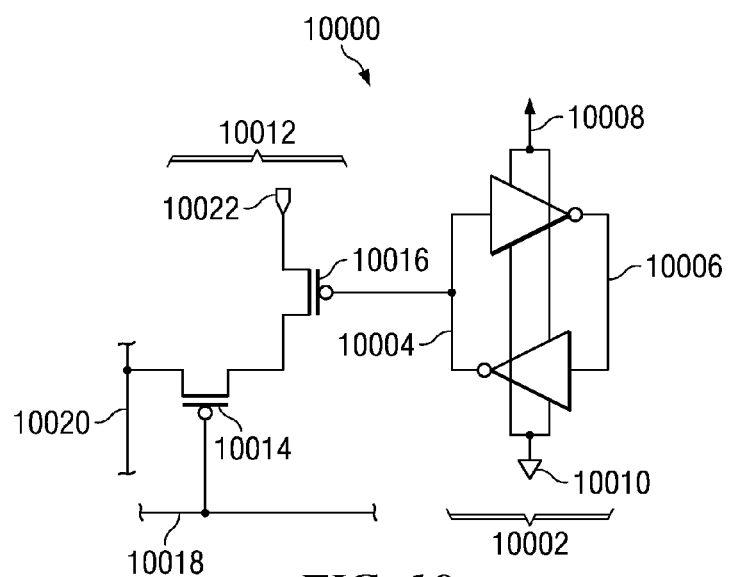
FIG. 10 is a circuit diagram of a part of an SRAM cell containing a read buffer with PMOS passgate transistors.

The read buffers in the SRAM cells (as described in reference to FIG. 2, FIG. 4, FIG. 5 and FIG. 7) may be formed with PMOS passgate transistors instead of NMOS passgate transistors. FIG. 10 is a circuit diagram of a part of an SRAM cell containing a read buffer with PMOS passgate transistors. The SRAM cell (10000) contains a pair of cross coupled inverters (10002) which include a bit-side data node (10004) and a bit-bar-side data node (10006). Power is supplied to the pair of cross-coupled inverters (10002) through an inverter Vdd node (10008). Ground potential is provided to the pair of cross-coupled inverters (10002) through an inverter Vss node (10010). The SRAM cell (10000) contains a read buffer (10012) which includes a PMOS access transistor (10014) and a PMOS read buffer driver transistor (10016). A gate node of the access transistor (10014) is connected to a read only word line (10018). A first source/drain node of the access transistor (10014) is connected to a data line (10020). A second source/drain node of the access transistor (10014) is connected to a drain node of the read buffer driver transistor (10016). A gate node of the read buffer driver transistor (10016) is connected to the bit-side data node (10004). A read buffer driver source node (10022) of the read buffer driver transistor (10016) may be floated or biased (for example by a read buffer driver transistor bias circuit, not shown) during read and write operations, as described in reference to FIG. 2 and FIG. 5, with appropriate changes in polarity.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   an array of SRAM cells, said SRAM cells being arranged in rows and columns, each said SRAM cell further including:
   a pair of cross-coupled inverters, said cross-coupled inverters including a bit-side data node and a bit-bar-side data node;
   a write port coupled to said pair of cross-coupled inverters, said write port including:
   a bit-side passgate transistor coupled to said pair of cross-coupled inverters, said bit-side passgate transistor further including a gate node, a first source/drain node and a second source/drain node, such that said gate node of said bit-side passgate transistor is connected to a write word line, said first source/drain node of said bit-side passgate transistor is connected to said bit-side data node and said second source/drain node of said bit-side passgate transistor is connected to a bit-side write data line; and
   a bit-bar-side passgate transistor coupled to said pair of cross-coupled inverters, said bit-bar-side passgate transistor further including a gate node, a first source/drain node and a second source/drain node, such that said gate node of said bit-bar-side passgate transistor is connected to said write word line, said first source/drain node of said bit-bar-side passgate transistor is connected to said bit-bar-side data node, and said second source/drain node of said bit-bar-side passgate transistor is connected to a bit-bar-side write data line;

a first read buffer coupled to said pair of cross-coupled inverters, said first read buffer including:

a first access transistor coupled to said pair of cross-coupled inverters, said first access transistor further including a gate node, a first source/drain node and a second source/drain node, such that said gate node of said first access transistor is connected to a first read only word line, and said first source/drain node of said first access transistor is connected to a first read data line; and a first read buffer driver transistor coupled to said pair of cross-coupled inverters, said first read buffer driver transistor further including a gate node, a drain node and a source node, such that said gate node of said first read buffer driver transistor is connected to one of said bit-side data node and said bit-bar-side data node, and said drain node of said first read buffer driver transistor is connected to said second source/drain node of said first access transistor; and a second read buffer coupled to said pair of cross-coupled inverters, said second read buffer including:

a second access transistor coupled to said pair of cross-coupled inverters, said second access transistor further including a gate node, a first source/drain node and a second source/drain node, such that said gate node of said second access transistor is connected to a second read only word line that is independent from said first read only word line, and said first source/drain node of said second access transistor is connected to a second read data line; and a second read buffer driver transistor coupled to said pair of cross-coupled inverters, said second read buffer driver transistor further including a gate node, a drain node and a source node, such that said gate node of said second read buffer driver transistor is connected to one of said bit-side data node and said bit-bar-side data node, and said drain node of said second read buffer driver transistor is connected to said second source/drain node of said second access transistor.

2. The integrated circuit of claim 1, in which said bit-side passgate transistor is an NMOS transistor, and said bit-bar-side passgate transistor is an NMOS transistor.

3. The integrated circuit of claim 1, in which said bit-side passgate transistor is a PMOS transistor, and said bit-bar-side passgate transistor is a PMOS transistor.

4. The integrated circuit of claim 1, in which said first access transistor is an NMOS transistor, and said first read buffer driver transistor is an NMOS transistor.

5. The integrated circuit of claim 1, further including read circuitry coupled to said pair of cross-coupled inverters, said read circuitry connected to said bit-side write data line and to said bit-bar-side write data line, and said read circuitry being configured such that a read operation may be performed through said bit-side passgate transistor and said bit-bar-side passgate transistor.

6. The integrated circuit of claim 1, in which said gate node of said first read buffer driver transistor is connected to said bit-side data node, and said gate node of said second read buffer driver transistor is connected to said bit-bar-side data node.

7. The integrated circuit of claim 1, in which said gate node of said first read buffer driver transistor is connected to said bit-bar-side data node; and said gate node of said second read buffer driver transistor is connected to said bit-bar-side data node.

8. The integrated circuit of claim 1, further including a second write port coupled to said pair of cross-coupled inverters in each said SRAM cell, said second write port including:

a second bit-side passgate transistor coupled to said pair of cross-coupled inverters, said second bit-side passgate transistor further including a gate node, a first source/drain node and a second source/drain node, such that said gate node of said second bit-side passgate transistor is connected to a second write word line, said first source/drain node of said second bit-side passgate transistor is connected to said bit-side data node and said second source/drain node of said second bit-side passgate transistor is connected to a second bit-side write data line; and a second bit-bar-side passgate transistor coupled to said pair of cross-coupled inverters, said second bit-bar-side passgate transistor further including a gate node, a first source/drain node and a second source/drain node, such that said gate node of said second bit-bar-side passgate transistor is connected to said second write word line, said first source/drain node of said second bit-bar-side passgate transistor is connected to said bit-bar-side data node, and said second source/drain node of said second bit-bar-side passgate transistor is connected to a second bit-bar-side write data line.

9. The integrated circuit of claim 8, further including read circuitry connected to said second bit-side write data line and to said second bit-bar-side write data line, wherein a read operation is performed through said second bit-side passgate transistor and said second bit-bar-side passgate transistor.

10. The integrated circuit of claim 1, in which said gate node of said first read buffer driver transistor is connected to said bit-bar-side data node; and said first read data line is identical with said bit-side write data line.

11. The integrated circuit of claim 1, in which said gate node of said first read buffer driver transistor is connected to said bit-bar-side data node, said gate node of said second read buffer driver transistor is connected to said bit-side data node, said first read data line is identical with said bit-side write data line, and said second read data line is identical with said bit-bar-side write data line.

12. The integrated circuit of claim 1, further including a third read buffer in each said SRAM cell, said third read buffer including:

a third access transistor, said third access transistor further including a gate node, a first source/drain node and a second source/drain node, such that said gate node of said third access transistor is connected to a third read only word line, and said first source/drain node of said third access transistor is connected to a third read data line; and a third read buffer driver transistor, said third read buffer driver transistor further including a gate node, a drain node and a source node, such that said gate node of said third read buffer driver transistor is connected to one of said bit-side data node and said bit-bar-side data node, and said drain node of said third read buffer driver transistor is connected to said second source/drain node of said third access transistor.

13. The integrated circuit of claim 1, further including a read buffer driver transistor bias circuit coupled to said array of SRAM cells, said read buffer driver transistor bias circuit biasing said source node of said first read buffer driver transistor and said source node of said second read buffer driver transistor in an addressed SRAM cell independently of said source node of said first read buffer driver transistor and said source node of said second read buffer driver transistor in a half-addressed SRAM cell.

14. The integrated circuit of claim 13, in which said read buffer driver transistor bias circuit biases said source node of said first read buffer driver transistor in said addressed SRAM cell independently of said source node of said second read buffer driver transistor in said addressed SRAM cell.

15. A process of performing a read operation, comprising:
floating a source node of a first read buffer driver transistor in a first read buffer in a half-addressed SRAM cell;
biasing a source node of a second read buffer driver transistor in a second read buffer in said half-addressed SRAM cell to Vss;
biasing a source node of a first read buffer driver transistor in a first read buffer in an addressed SRAM cell to Vss;
biasing a source node of a second read buffer driver transistor in a second read buffer in said addressed SRAM cell to Vss;
turning on a first access transistor in said first read buffer in said addressed SRAM cell; and
turning on a first access transistor in said first read buffer in a half-addressed SRAM cell.

16. The process of claim 15, further including performing a read operation through a write port of said addressed SRAM cell, comprising:
biasing said source node of said first read buffer driver transistor in said half-addressed SRAM cell to Vss;
biasing said source node of said second read buffer driver transistor in said half-addressed SRAM cell to Vss;
biasing said source node of said first read buffer driver transistor in said addressed SRAM cell to Vss;
biasing said source node of said second read buffer driver transistor in said addressed SRAM cell to Vss;
biasing a bit-side data line of said addressed SRAM cell;
biasing a bit-bar-side data line of said addressed SRAM cell;
turning on a bit-side passgate transistor and a bit-bar-side passgate transistor of said addressed SRAM cell; and
turning on a bit-side passgate transistor and a bit-bar-side passgate transistor of said half-addressed SRAM cell.

17. A process of performing a read operation, comprising:
floating a source node of a first read buffer driver transistor in a first read buffer in a half-addressed SRAM cell;
floating a source node of a second read buffer driver transistor in a second read buffer in said half-addressed SRAM cell;
floating a source node of a first read buffer driver transistor in a first read buffer in an addressed SRAM cell;
floating a source node of a second read buffer driver transistor in a second read buffer in said addressed SRAM cell;
turning on a first access transistor in said first read buffer in said addressed SRAM cell; and
turning on a first access transistor in said first read buffer in a half-addressed SRAM cell.

18. The process of claim 17, further including performing a read operation through a write port of said addressed SRAM cell, comprising:
floating said source node of said first read buffer driver transistor in said half-addressed SRAM cell;
floating said source node of said second read buffer driver transistor in said half-addressed SRAM cell;
floating said source node of said first read buffer driver transistor in said addressed SRAM cell;
floating said source node of said second read buffer driver transistor in said addressed SRAM cell;
biasing a bit-side data line of said addressed SRAM cell;
biasing a bit-bar-side data line of said addressed SRAM cell;
turning on a bit-side passgate transistor and a bit-bar-side passgate transistor of said addressed SRAM cell; and
turning on a bit-side passgate transistor and a bit-bar-side passgate transistor of said half-addressed SRAM cell.

19. A process of performing a read operation, comprising:
biasing a source node of a first read buffer driver transistor in a first read buffer in a half-addressed SRAM cell to Vss;
floating a source node of a second read buffer driver transistor in a second read buffer in said half-addressed SRAM cell;
biasing a source node of a first read buffer driver transistor in a first read buffer in an addressed SRAM cell to Vss;
biasing a source node of a second read buffer driver transistor in a second read buffer in said addressed SRAM cell to Vss;
turning on a first access transistor in said first read buffer in said addressed SRAM cell; and
turning on a first access transistor in said first read buffer in a half-addressed SRAM cell.

20. A process of performing a read operation, comprising:
biasing a source node of a first read buffer driver transistor in a first read buffer in a half-addressed SRAM cell to Vss;
biasing a source node of a second read buffer driver transistor in a second read buffer in said half-addressed SRAM cell to Vss;
biasing a source node of a first read buffer driver transistor in a first read buffer in an addressed SRAM cell to Vss;
floating a source node of a second read buffer driver transistor in a second read buffer in said addressed SRAM cell;
turning on a first access transistor in said first read buffer in said addressed SRAM cell; and
turning on a first access transistor in said first read buffer in a half-addressed SRAM cell.

21. The integrated circuit of claim 1, in which said source node of said first read buffer driver transistor is floated or biased during read and write operations.

22. The integrated circuit of claim 1, in which said source node of said second read buffer driver transistor is floated or biased during read and write operations.

23. The integrated circuit of claim 22, in which said source node of said first read buffer driver transistor is floated or biased independently from said source node of said second read buffer driver transistor.

* * * * *